United States Patent
Chen et al.

(10) Patent No.: US 9,601,349 B2
(45) Date of Patent: Mar. 21, 2017

(54) ETCHING METHOD

(75) Inventors: Yu-Chung Chen, Hsinchu (TW); Hsin-Fang Su, Hsinchu (TW); Shih-Chang Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 2097 days.

(21) Appl. No.: 12/372,111

(22) Filed: Feb. 17, 2009

(65) Prior Publication Data
US 2010/0209675 A1   Aug. 19, 2010

(51) Int. Cl.
*B44C 1/22* (2006.01)
*H01L 21/3213* (2006.01)
*H01L 21/311* (2006.01)

(52) U.S. Cl.
CPC .. *H01L 21/32139* (2013.01); *H01L 21/31116* (2013.01); *Y10T 428/24802* (2015.01)

(58) Field of Classification Search
None
See application file for complete search history.

(56) References Cited

U.S. PATENT DOCUMENTS 6,388,736 B1 * 5/2002 Smith et al. ............. 355/53
7,271,106 B2   9/2007 Abatchev et al.
2005/0070111 A1 * 3/2005 Kushibiki et al. ........ 438/695
2006/0046483 A1 * 3/2006 Abatchev et al. ........ 438/689
2006/0293208 A1 * 12/2006 Egbe et al. ............... 510/407
2007/0037371 A1   2/2007 Wang et al.

FOREIGN PATENT DOCUMENTS

TW   200641519   12/2006
TW   I277135     3/2007

OTHER PUBLICATIONS

Ohiwa et al, SiO2 Tapered Etching Employing Magnetron Discharge of Fluorocarbon Gas, Feb. 1992, Jpn. J. Appl. Phys., vol. 31, p. 405-410.*

* cited by examiner

*Primary Examiner* — Binh X Tran
*Assistant Examiner* — David Cathey, Jr.
(74) *Attorney, Agent, or Firm* — J. C. Patents

(57) ABSTRACT

The invention is directed to a method for patterning a material layer. The method comprises steps of providing a material layer having a first hard mask layer and a second hard mask layer successively formed thereon and then patterning the second hard mask layer. Thereafter, an etching process is performed to pattern the first hard mask layer by using the patterned second hard mask layer as a mask, and the etching process is performed with a power of about 1000 W. Next, the material layer is patterned by using the patterned first hard mask layer as a mask.

7 Claims, 2 Drawing Sheets

ETCHING METHOD

BACKGROUND OF THE INVENTION

Field of Invention

The present invention relates to an etching method. More particularly, the present invention relates to a method for patterning a material layer.

Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished.

However, the critical dimension of the pattern in the photoresist layer is affected by several factors including the exposure dosage, thickness of the photoresist layer and the variables in the development process. With the decrease of the size of the device, the line width of the device is getting smaller and smaller. Therefore, a small amount difference between the critical dimension of the device and the expected critical dimension will lead to dramatic changes in electrical performance of the device. However, as the critical dimension of the device is decreased, the aberration caused by the photo tools strongly affects the appearance of the critical dimension.

SUMMARY OF THE INVENTION

Accordingly, the present invention is to, provide a method for patterning a material layer capable of automatically recover the critical-dimension bias shift happening during a pattern is transferred onto the topmost hard mask.

The present invention is to provide a method for patterning a material layer capable of increasing the process window for transferring the pattern onto the material layer.

The invention provides a patterning method. The method comprises steps of providing a substrate having a first region and a second region. A first hard mask layer and a second hard mask layer are successively formed on the substrate. Then, the second hard mask layer is patterned so as to form a pattern in the second hard mask layer. Thus, a first critical dimension of the pattern in the first region is different from a second critical dimension of the pattern in the second region. Thereafter, an etching process is performed to pattern the first hard mask layer by using the patterned second hard mask layer as a mask, and the pattern is transferred into the first hard mask layer with a third critical dimension in the first region and a fourth critical dimension in the second region and the third critical dimension is substantially equal to the fourth critical dimension.

According to one embodiment of the present invention, the etching selectivity ratio of the second hard mask layer to the first hard mask layer is larger than 15.

According to one embodiment of the present invention, the etching process is performed with a power of about 1000 W.

According to one embodiment of the present invention, the second critical dimension is smaller than the first critical dimension.

According to one embodiment of the present invention, the difference between the second critical dimension and the first critical dimension is smaller than 10% of the first critical dimension.

According to one embodiment of the present invention, the difference between the second critical dimension and the first critical dimension is smaller than 10 nm.

According to one embodiment of the present invention, the fourth critical dimension is performed is substantially equal to the first critical dimension.

According to one embodiment of the present invention, the first critical dimension is about 70~80 nm.

According to one embodiment of the present invention, the substrate further comprises a material layer formed thereon and the material layer is interposed between the substrate and the first hard mask layer and the patterning method further comprises patterning the material layer by using the patterned first hard mask layer as a mask.

The invention also provide a patterning method for being applied over a substrate. The substrate has a first region and a second region. The method comprises steps of forming a first hard mask layer over the substrate and then forming a second hard mask layer on the first hard mask layer. Thereafter, the second hard mask layer is patterned by transferring a pattern onto the second hard mask layer so that the patterned second hard mask layer possesses a first critical dimension in the first region and a second critical dimension in the second region. Afterward, an etching process is performed on the first hard mask layer by using the patterned second hard mask layer as a mask so as to transfer the pattern onto the first hard mask layer. The portion of the pattern in the first hard mask layer in the first region has a first sidewall profile with a first obliquity and the portion of the pattern in the first hard mask layer in the second region has a second sidewall profile with a second obliquity and the first obliquity is different from the second obliquity.

According to one embodiment of the invention, the third critical dimension is substantially equal to the fourth critical dimension.

According to one embodiment of the invention, the first critical dimension is about 70~80 nm.

The invention further provides an intermediate structure on a substrate having a first region and a second region. The intermediate structure comprises a patterned multilayered mask layer. The patterned multilayered mask layer is disposed over the substrate and the patterned multilayered mask layer has an upper mask layer and a bottom mask layer. The portion of the patterned mask layer in the first region has a first sidewall profile with a first obliquity and the portion of the patterned mask layer in the second region has a second sidewall profile with a second obliquity. The first obliquity is different from the second obliquity and a critical dimension of the patterned mask layer is uniform in both of the first region and the second region.

In the present invention, by using the etching process provided by the present invention, even though the second critical dimension is slightly shifted with an amount smaller than 10 nm or less than 10% of the first critical dimension, the resulted critical dimension, that is the third critical dimension, is almost equal to the fourth critical dimension of the pattern. That is, by maintaining high operation power of about 100 W during the etching process, the etching selectivity is improved and the critical dimension shift while the pattern is transferred onto the second hard mask layer can be gradually recovered. Even though the bias shifting is very small and even smaller than 10 nm or less than 10% of the original critical dimension of the pattern, the etching process provided by the present invention can automatically recover the bias shift of the critical dimension.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
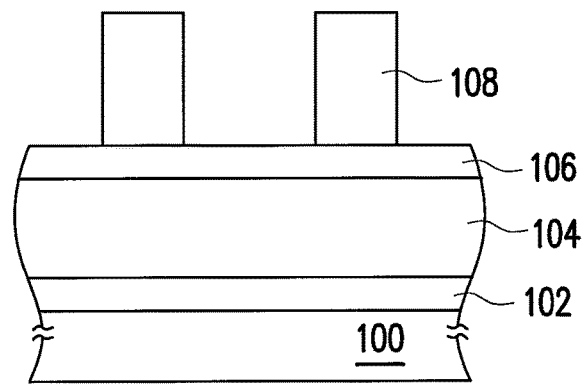
FIGS. 1A through 1D are cross-sectional views showing a method for patterning a material layer according to one embodiment of the invention.

FIGS. 1A through 1D are cross-sectional views showing a method for patterning a material layer according to one embodiment of the invention. As shown in FIG. 1A, a substrate 100 having a material layer 102 formed thereon is provided. The material layer 102 can be, for example but not limited to, made of polysilicon or other conductive layer predetermined to for conductive lines. Then, a first hard mask layer 104 and a second hard mask layer 106 are successively formed on the material layer The first hard mask layer 104 can be, for example but not limited to, made from tetraethylorthosilicate (TEOS) by chemical vapor deposition (CVD). Moreover, the thickness of the first hard mask layer 104 is about 1500 angstroms. The second hard mask layer can be, for example but not limited to, made of polysilicon. Further, the thickness of the second hard mask layer 106 is about 500 angstroms. Thereafter, a patterned photoresist layer 108 is formed over the substrate 100. The method for forming the patterned photoresist layer 108 comprises steps of forming a photoresist layer (not shown) on the second hard mask layer 106 and then performing a photolithography process to transfer a pattern from a photomask. Ideally, the critical dimension of the copied pattern in the patterned photoresist layer 108 is about 70~80 nm.

Figure 1B:
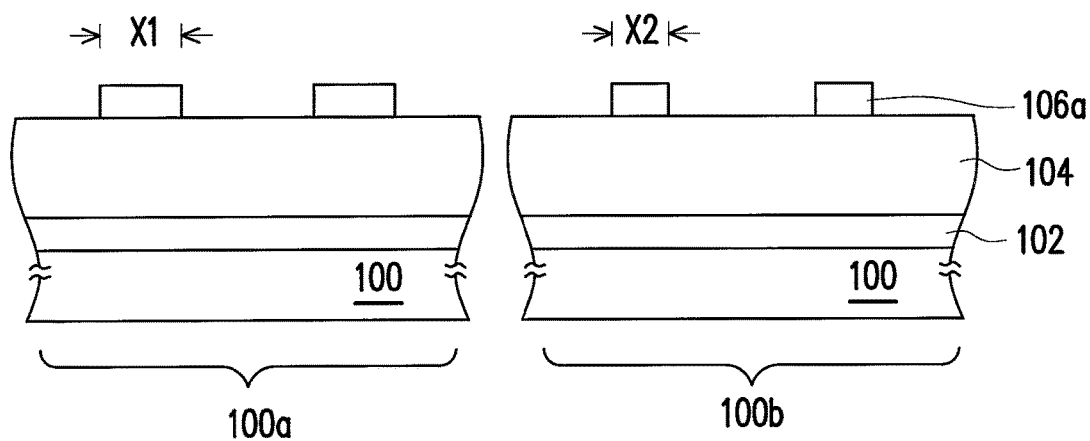

As shown in FIG. 1B, the second hard mask layer 106 is patterned by using the patterned photoresist 108 as a mask. Therefore, the pattern in the patterned photoresist layer 108 is copied into the second hard mask layer 106. Because of the loading effect, the critical dimension of the copied pattern in the second hard mask layer 106 in some specific regions shifts. Therefore, the substrate 100 is divided into a first region 100a, in which the critical dimension X1 of the copied pattern is as same as that of the pattern in the patterned photoresist layer 108, and a second region 100b, in which the critical dimension X2 of the copied pattern shifts away from the critical dimension of the pattern in the patterned photoresist layer 108. That is, the critical dimension X2 of the pattern in the second region 100b is different from the critical dimension X1 of the pattern in the first region 100a. More specifically the critical dimension X2 is smaller than the critical dimension of the pattern in the patterned photoresist layer 108. Then, the patterned photoresist layer 108 is removed. The method for patterning the second hard mask layer 106 includes a plasma etching process.

Figure 1C:
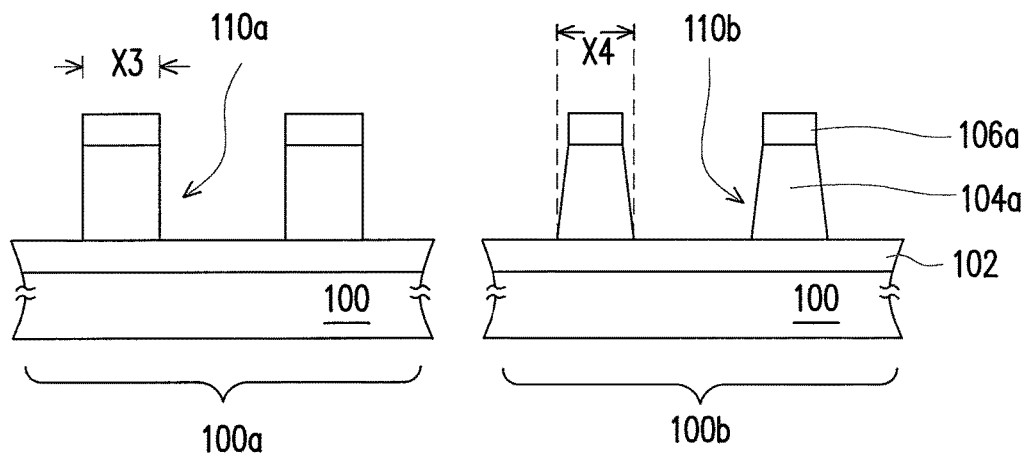

Then, as shown in FIG. 1C, an etching process 112 is performed to transfer the pattern 110a onto the first hard mask layer 104 from the patterned second hard mask layer 106a so that a portion of the first hard mask layer 104 in the first region 100a is converted to be a patterned first hard mask layer 104a with a third critical dimension X3 and a portion of the first hard mask layer 104 in the second region 100b is converted to be the patterned first hard mask layer 104a with a fourth critical dimension X4. Furthermore, the third critical dimension X3 does not shift during the pattern is transferred from the second hard mask layer so that the critical dimension X3 is equal to the critical dimension of the pattern in the patterned photoresist layer 108. It should be noticed that, by performing the patterning process at the same time, the critical dimension X3 of the pattern in the first hard mask layer 104 in the first region 100a is equal to the critical dimension X4 of the pattern in the first had mask layer 104 in the second region 100b. That is, by performing the etching process disclosed by the present invention, the shifted critical dimension X2 of the pattern in the second hard mask layer 106a is adjusted to be the critical dimension X4 as the pattern in the second hard mask layer 106a is transferred into the first hard mask layer. Therefore, the critical dimensions of the pattern in both of the first region 100a and the second region 100b are unified. The etching process for patterning the first hard mask layer 104 can be, for example but not limited to, a plasma etching performed with a power of about 1000 W. The plasma etching can be, for example, a high density plasma etching. Furthermore, as to the etching process, the etching selectivity ratio of the second hard mask layer 106 to the first hard mask layer 104 is larger than 15.

It should be noticed that the portion of the first hard mask layer 104a in the first region 100a has a sidewall profile 110a with a first obliquity and the portion of the first hard mask layer 104a in the second region 100b has a sidewall profile 110b with a second obliquity. It is obvious, as shown in FIG. 1C, that the first obliquity is different from the second obliquity. Although the first obliquity is different from the second obliquity, the critical dimension X3 of the first hard mask layer in the first region 100a is substantially equal to the critical dimension X4 of the first hard mask layer in the second region 100b.

Figure 1D:
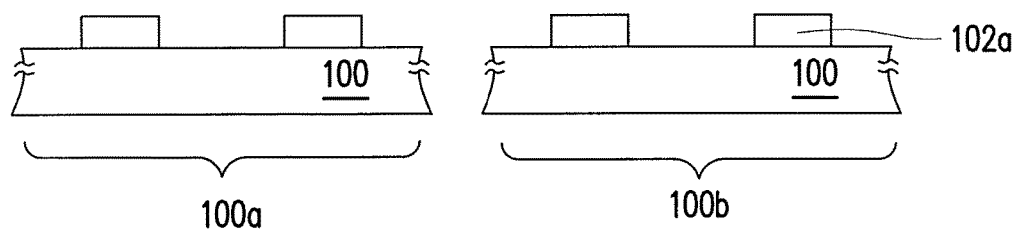

As shown in FIG. 1D, the material layer 102 is patterned by using the patterned first hard mask layer 104a as a mask. Afterward, the patterned first hard mask layer 104a and the patterned second hard mask layer 106a are removed. Since the third critical dimension X3 of the pattern in the first hard mask layer 104a in first region 100a is similar to the fourth critical dimension X4 of the pattern in the first hard mask layer 104a in the second region 100b, the result critical dimension of the pattern in the material layer 102a is unified.

The present invention further provides an intermediate structure shown in FIG. 1C. In the intermediate structure, a patterned multilayered mask layer is disposed over the substrate 100. The patterned multilayered mask layer has an upper mask layer (i.e. the second hard mask layer 106a) and a bottom mask layer (i.e. the first hard mask layer 104a) and the upper mask layer 106a is stacked on the bottom mask layer 104a. The portion of the bottom mask layer 104a in the first region 100a of the substrate 100 has a sidewall profile 110a with a first obliquity and the portion of the bottom mask layer 104a in the second region 100b of the substrate 100 has a sidewall profile 110b with a second obliquity. The first obliquity is different from the second obliquity but the critical dimensions of the bottom mask layer 104a in both of the first region 100a and the second region 100b are uniform. That is, although the first critical dimension X1 of the upper mask layer 106a in the first region 100a is different from the second critical dimension X2 of the upper mask layer 106a in the second region 100b, the critical dimensions of the bottom mask layer 104a in both of the first region 100a and the second region 100b are even.

It should be noticed that during the mask pattern is transferred from the photomask to the photoresist layer and from the patterned photoresist layer 108 to the first hard mask layer 104, the critical dimension can be shift due to various factors including the operation condition of the lithography tool shifting or other external influences. Accordingly, every time the pattern is transferred from one layer to the other layer, it is highly possible that the critical dimension of the resulted pattern shifts. In one embodiment, when the pattern is transferred onto the second hard mask layer 106, the critical dimension shifts and the second critical dimension X2 is smaller than the first critical dimension X1 which does not shift during the pattern transferring from layers to layers. Therefore, in the present invention, under the etching condition of the etching process mentioned above, the critical dimension bias shifting can be automatically recovered during the etching process for patterning the first hard mask layer 104. Hence, even though the second critical dimension X2 is slightly shifted with an amount smaller than 10 nm or less than 10% of the first critical dimension X1, the resulted critical dimension, that is the fourth critical dimension X4 is almost equal to the third critical dimension, that is the fourth critical dimension X4 is larger than the second critical dimension X2 and almost equal to the critical dimension X1 or X3 of the pattern. That is, although the bias shifting is very small and even smaller than 10 nm or less than 10% of the original critical dimension of the pattern, the etching process provided by the present invention can automatically recover the bias shift of the critical dimension. Hence, the process window for transferring the pattern onto the material layer is increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A patterning method comprising:
   providing a substrate having a first region and a second region;
   successively forming a first hard mask layer and a second hard mask layer on the substrate;
   patterning the second hard mask layer so as to form a pattern in the second hard mask layer, wherein a first critical dimension of the pattern in the first region is different from a second critical dimension of the pattern in the second region; and
   performing an etching process to pattern the first hard mask layer by using the patterned second hard mask layer as a mask, wherein the pattern is transferred into the first hard mask layer with a third critical dimension in the first region and a fourth critical dimension in the second region and the third critical dimension is substantially equal to the fourth critical dimension.

2. The patterning method of claim 1, wherein the etching selectivity ratio of the second hard mask layer to the first hard mask layer is larger than 15.

3. The patterning method of claim 1, wherein the second critical dimension is smaller than the first critical dimension.

4. The patterning method of claim 1, wherein the difference between the second critical dimension and the first critical dimension is smaller than 10 nm.

5. The patterning method of claim 1, wherein the fourth critical dimension is substantially equal to the first critical dimension.

6. The patterning method of claim 1, wherein the first critical dimension is about 70~80 nm.

7. The patterning method of claim 1, wherein the substrate further comprises a material layer formed thereon and the material layer is interposed between the substrate and the first hard mask layer and the patterning method further comprises patterning the material layer by using the patterned first hard mask layer as a mask.

\* \* \* \* \*